United States Patent
Omoto

(10) Patent No.: US 9,107,252 B2
(45) Date of Patent: Aug. 11, 2015

(54) DISPLAY PANEL, DISPLAY UNIT, AND ELECTRONIC APPARATUS

(71) Applicant: Sony Corporation, Tokyo (JP)

(72) Inventor: Keisuke Omoto, Kanagawa (JP)

(73) Assignee: JOLED INC. (JP)

( * ) Notice: Subject to any disclaimer, the term of this patent is extended or adjusted under 35 U.S.C. 154(b) by 344 days.

(21) Appl. No.: 13/785,155

(22) Filed: Mar. 5, 2013

(65) Prior Publication Data

US 2013/0234624 A1  Sep. 12, 2013

(30) Foreign Application Priority Data

Mar. 12, 2012 (JP) .................. 2012-054068

(51) Int. Cl.
*H05B 37/00* (2006.01)
*H05B 33/08* (2006.01)
*G09G 3/32* (2006.01)
*H01L 27/32* (2006.01)

(52) U.S. Cl.
CPC .............. *H05B 33/08* (2013.01); *G09G 3/3241* (2013.01); *H01L 27/326* (2013.01); *H01L 27/3276* (2013.01); *G09G 2300/0426* (2013.01); *G09G 2300/0439* (2013.01)

(58) Field of Classification Search
None
See application file for complete search history.

(56) References Cited

U.S. PATENT DOCUMENTS

| | | | |
|---|---|---|---|
| 6,847,428 B1 * | 1/2005 | Sekiguchi et al. ............ | 349/139 |
| 8,582,057 B2 * | 11/2013 | Jung et al. ........................ | 349/69 |
| 2007/0075627 A1 * | 4/2007 | Kimura et al. ................. | 313/503 |
| 2007/0295973 A1 * | 12/2007 | Jinbo et al. ....................... | 257/88 |
| 2014/0103368 A1 * | 4/2014 | Hatano et al. ................... | 257/88 |

FOREIGN PATENT DOCUMENTS

JP  2007-41574 A  2/2007

* cited by examiner

*Primary Examiner* — Cassandra Cox
(74) *Attorney, Agent, or Firm* — Sheridan Ross P.C.

(57) ABSTRACT

A display panel is provided with a plurality of pixels each including: a plurality of light emitting devices connected in parallel to one another, wherein each of the light emitting devices includes a transparent electrode, a reflecting electrode, and an organic layer interposed between the transparent electrode and the reflecting electrode, and the organic layer has a light emitting layer; a pixel circuit driving the light emitting devices; and a plurality of wiring lines connecting each of the light emitting devices and the pixel circuit directly to each other, wherein each of the wiring lines is provided in a same plane as the reflecting electrode, and has a width smaller than a width of the reflecting electrode.

7 Claims, 15 Drawing Sheets

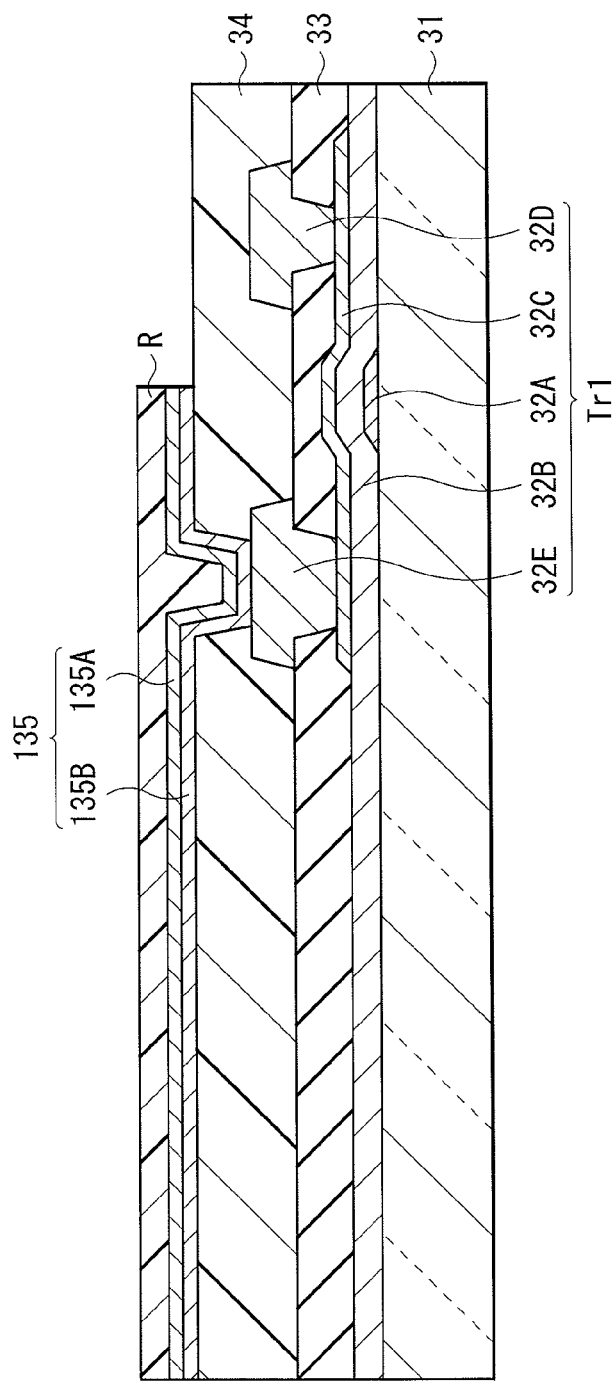
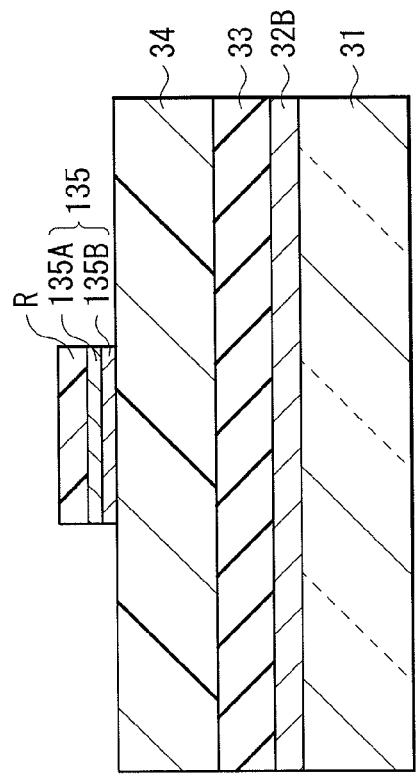
FIG. 14A
FIG. 14B

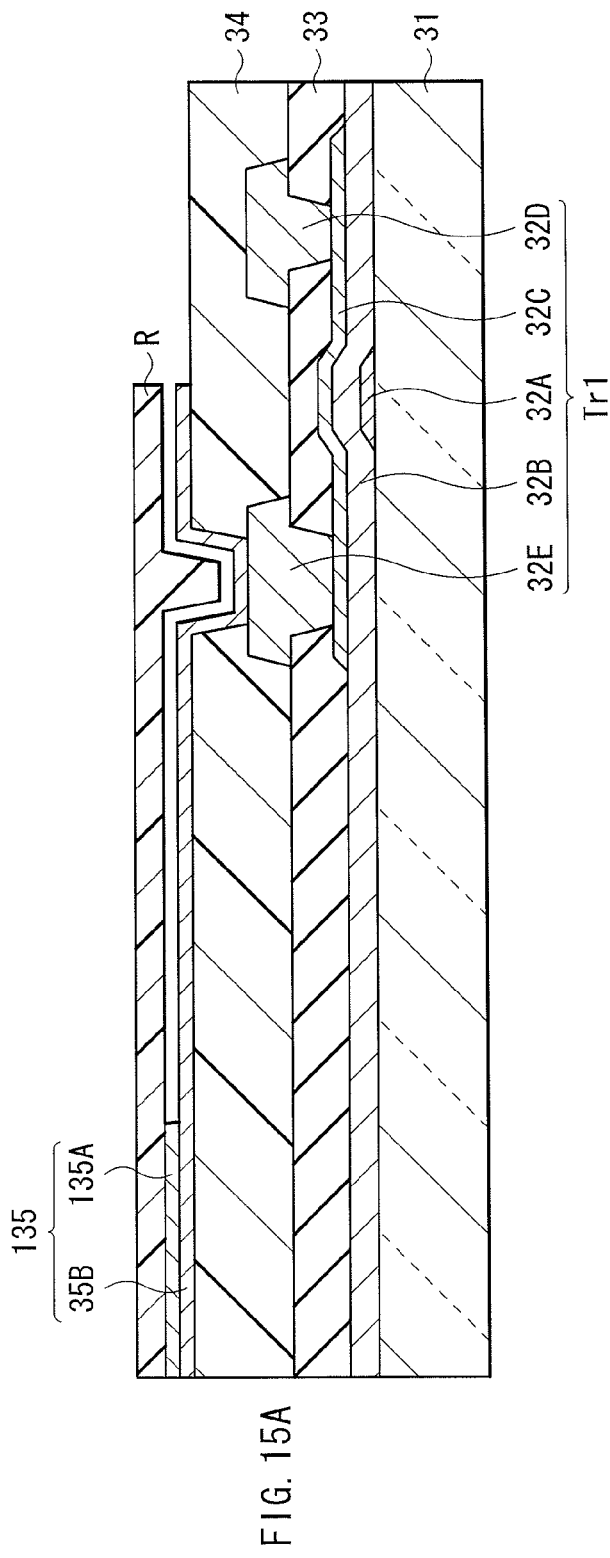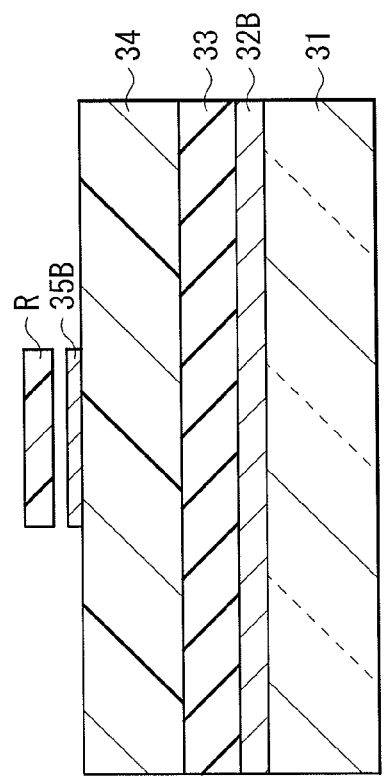
FIG. 15A
FIG. 15B

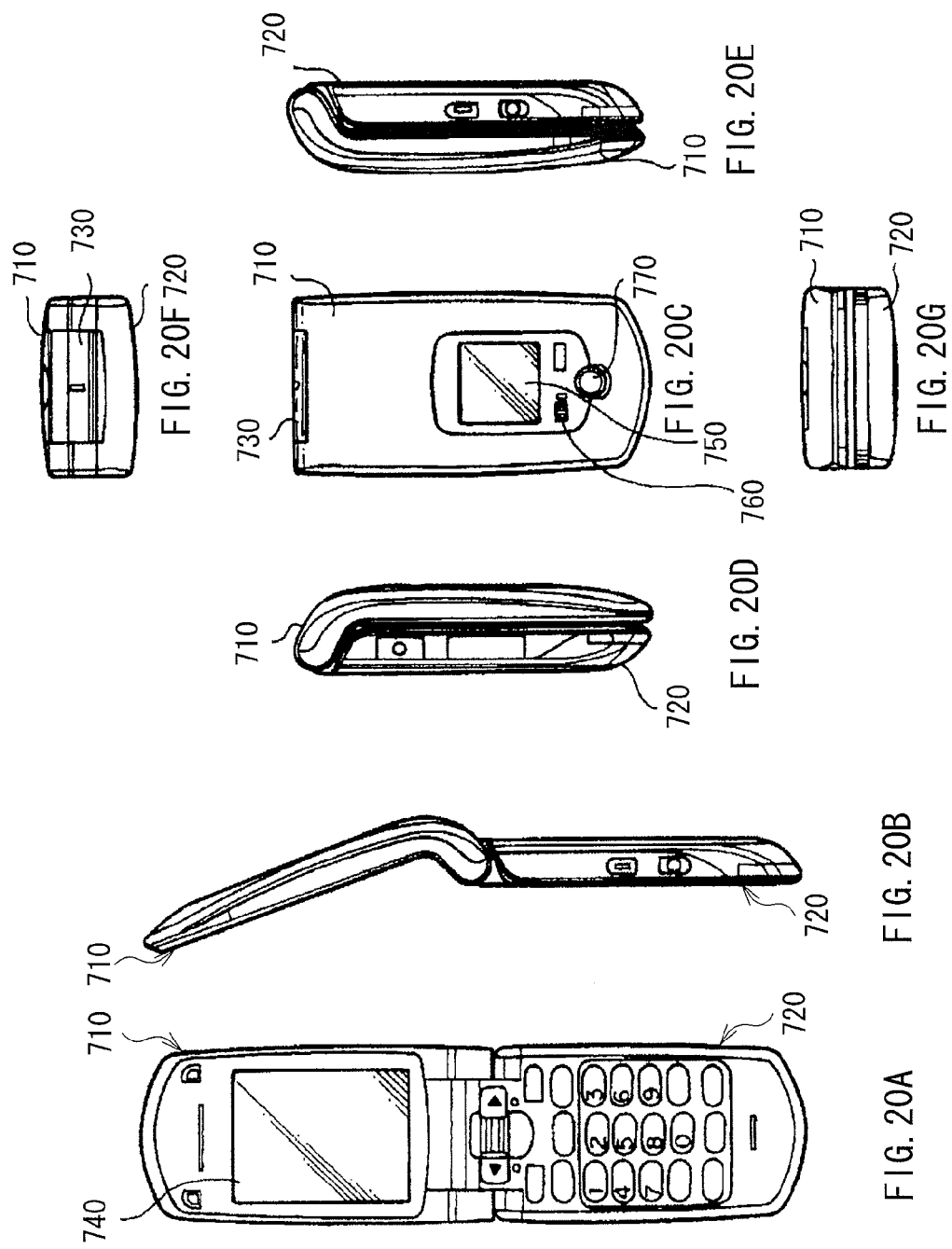

DISPLAY PANEL, DISPLAY UNIT, AND ELECTRONIC APPARATUS

BACKGROUND

The present technology relates to a display panel capable of improving an unlit defect, and to a display unit and an electronic apparatus that include the display panel.

In recent years, in the field of display units for image display, there have been developed and commercialized display units using, as a light emitting device of a pixel, a light emitting device of a current-driven type, such as an organic EL device, in which luminance is varied in accordance with the value of a current flowing therein. Unlike a liquid crystal device and the like, an organic EL device is a self-emitting device. Therefore, since display units (organic EL display units) using an organic EL device do not necessitate light source (backlight), such display units provide reduced thickness and higher luminance in comparison with liquid crystal display units that necessitate light source.

The driving scheme of organic EL display units includes a simple (passive) matrix scheme and an active matrix scheme as is the case with liquid crystal display units. The simple (passive) matrix scheme has a simple structure; however, there are issues such as that it is difficult to realize a large-size and high-definition display unit with the simple (passive) matrix scheme. Therefore, today, the active matrix scheme has been vigorously developed. Under this scheme, a current flowing through a light emitting device provided for each pixel is controlled by an active device (commonly, a TFT (thin film transistor)) provided in a driving circuit provided for each light emitting device.

Incidentally, an organic EL device has a structure in which an organic layer including a light emitting layer is interposed between an anode electrode and a cathode electrode. If a foreign substance enters an organic EL display unit using the organic EL device having the above-mentioned structure as a light emitting device of a pixel in a process of forming the organic EL device, then a luminance defect of the pixel occurs. Specifically, a short circuit may take place between an anode electrode and a cathode electrode of the organic EL device due to the entrance of the foreign substance in the organic EL in the manufacturing process. When this short circuit between electrodes of an organic EL device occurs, the organic EL ceases to emit light, thus causing a luminance defect that is a so-called "unlit spot" in which a sub pixel including this organic EL device is visually recognized as a non-light emitting pixel.

As a countermeasure against this luminance defect due to the entrance of a foreign substance, there has been proposed a technique in which a plurality of sets of component devices including an organic EL device are provided in one sub pixel (for example, see Japanese Unexamined Patent Application Publication No. 2007-41574). With this technology, even if an organic EL device in one of the sets becomes a defect due to a short circuit between electrodes or the like, a component device in another set normally operates to prevent the sub pixel from becoming the unlit spot.

SUMMARY

However, the above-mentioned countermeasure makes the pixel circuit complicated.

It is desirable to provide a display panel capable of improving an unlit defect without making a pixel circuit complicated, and a display unit and an electronic apparatus that include the display panel.

A display panel according to an embodiment of the present technology is provided with a plurality of pixels. Each of the pixels includes: a plurality of light emitting devices connected in parallel to one another, wherein each of the light emitting devices includes a transparent electrode, a reflecting electrode, and an organic layer interposed between the transparent electrode and the reflecting electrode, and the organic layer has a light emitting layer; a pixel circuit driving the light emitting devices; and a plurality of wiring lines connecting each of the light emitting devices and the pixel circuit directly to each other, wherein each of the wiring lines is provided in a same plane as the reflecting electrode, and has a width smaller than a width of the reflecting electrode.

A display unit according to an embodiment of the present technology is provided with a display panel and a driving circuit that drives the display panel. The display panel is provided with a plurality of pixels. Each of the pixels includes: a plurality of light emitting devices connected in parallel to one another, wherein each of the light emitting devices includes a transparent electrode, a reflecting electrode, and an organic layer interposed between the transparent electrode and the reflecting electrode, and the organic layer has a light emitting layer; a pixel circuit driving the light emitting devices; and a plurality of wiring lines connecting each of the light emitting devices and the pixel circuit directly to each other, wherein each of the wiring lines is provided in a same plane as the reflecting electrode, and has a width smaller than a width of the reflecting electrode.

An electronic apparatus according to an embodiment of the present technology is provided with a display unit. The display unit is provided with a display panel and a driving circuit that drives the display panel. The display panel is provided with a plurality of pixels. Each of the pixels includes: a plurality of light emitting devices connected in parallel to one another, wherein each of the light emitting devices includes a transparent electrode, a reflecting electrode, and an organic layer interposed between the transparent electrode and the reflecting electrode, and the organic layer has a light emitting layer; a pixel circuit driving the light emitting devices; and a plurality of wiring lines connecting each of the light emitting devices and the pixel circuit directly to each other, wherein each of the wiring lines is provided in a same plane as the reflecting electrode, and has a width smaller than a width of the reflecting electrode.

In the display panel, the display unit, and the electronic apparatus according to the above-described respective embodiments of the present technology, each of the wiring lines connecting each light emitting device and the pixel circuit directly to each other is provided in the same plane as the reflecting electrode, and is smaller in width than the reflecting electrode. With this configuration, for example, even when any of the light emitting devices becomes an defect due to a short circuit between electrodes or the like, and thus the pixel becomes an unlit defect, it is possible to restore the pixel as the unlit defect by disconnecting a wiring line directly connecting the organic EL device as the defect and the pixel circuit by a method such as, but not limited to, laser irradiation.

According to the display panel, the display unit, and the electronic apparatus of the above-described respective embodiments of the present technology, for example, even when any of the light emitting devices becomes an defect due to a short circuit between electrodes or the like, and thus the pixel becomes an unlit defect, it is possible to restore the pixel as the unlit defect by disconnecting a wiring line directly connecting the organic EL device as the defect and the pixel circuit by a method such as, but not limited to, laser irradiation. Therefore, it is possible to improve the unlit defect without making the pixel circuit complicated.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 14A and 14B are sectional views for describing a step subsequent to that illustrated in FIGS. 13A and 13B.

FIGS. 15A and 15B are sectional views for describing a step subsequent to that illustrated in FIGS. 14A and 14B.

FIG. 20A is a front view showing an unfolded state of an application example 5, FIG. 20B is a side view thereof, FIG. 20C is a front view showing a folded state, FIG. 20D is a left side view, FIG. 20E is a right side view, FIG. 20F is a top view, and FIG. 20G is a bottom view thereof.

DETAILED DESCRIPTION

With reference to the drawings, an embodiment of the technology will be described in detail below. It is to be noted that description will be made in the following order.
1. Embodiment (Display Unit)
2. Modification (Display Unit)
3. Application Examples (Electronic Apparatus)

1. EMBODIMENT

[Configuration]

Figure 1:
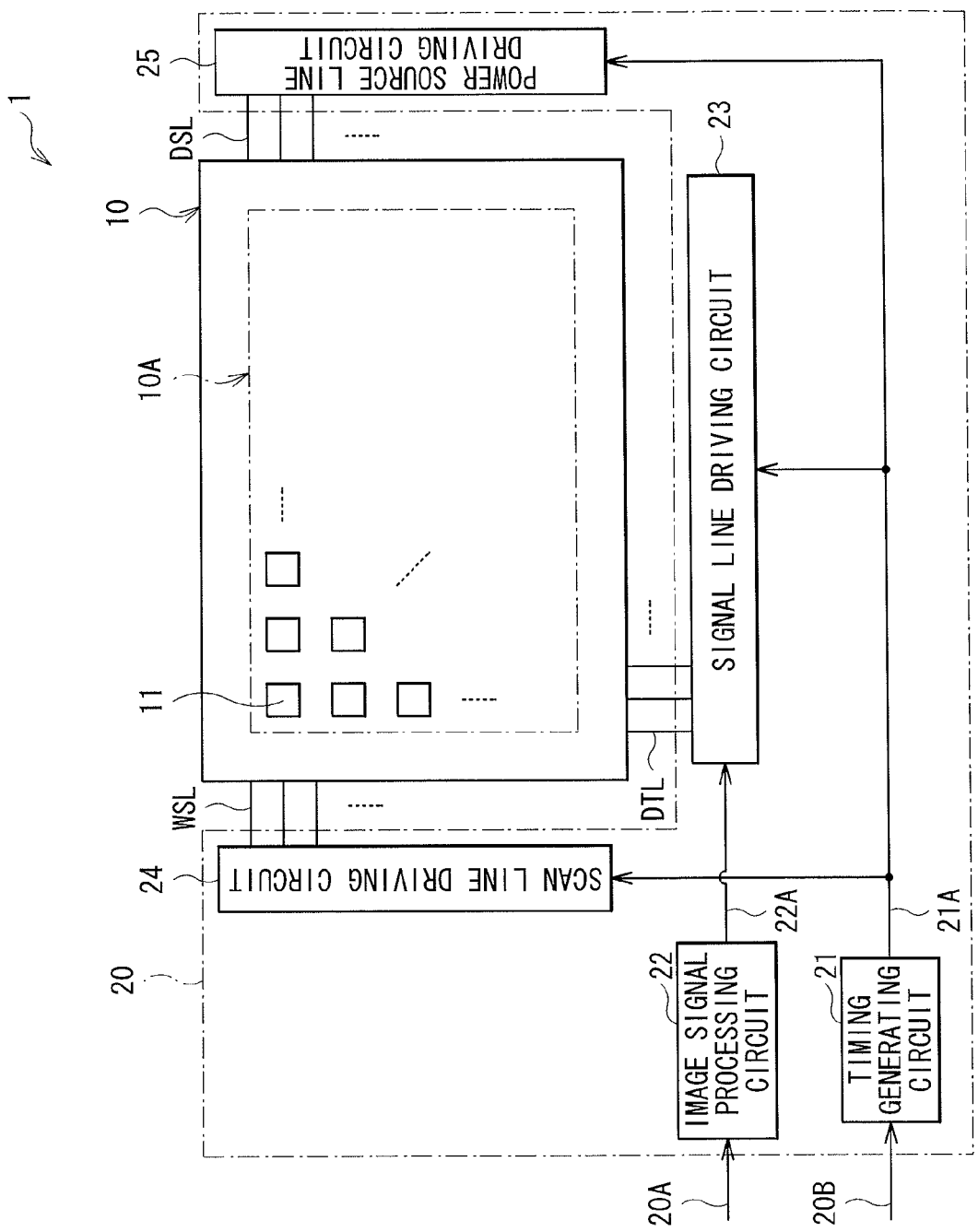
FIG. 1 is a view showing a schematic configuration of a display unit according to an embodiment of the present technology.

FIG. 1 shows a schematic configuration of a display unit 1 according to an embodiment of the present technology. The display unit 1 includes a display panel 10 and a driving circuit 20 that drives the display panel 10 based on an image signal 20A and a synchronization signal 20B inputted from the outside. The driving circuit 20 includes, for example, a timing generating circuit 21, an image signal processing circuit 22, a signal line driving circuit 23, a scan line driving circuit 24, and a power source line driving circuit 25.

(Display Panel 10)

The display panel 10 includes a plurality of pixels 11 two-dimensionally disposed all over a display region 10A of the display panel 10. The pixel 11 corresponds to a dot as a minimal element configuring the screen of the display panel 10. In the case where the display panel 10 is a color display panel, the pixel 11 is a sub pixel that emits single color light such as red light, green light, and blue light. In the case where the display panel 10 is a monochrome display panel, the pixel 11 is a pixel that emits white light.

Figure 2:
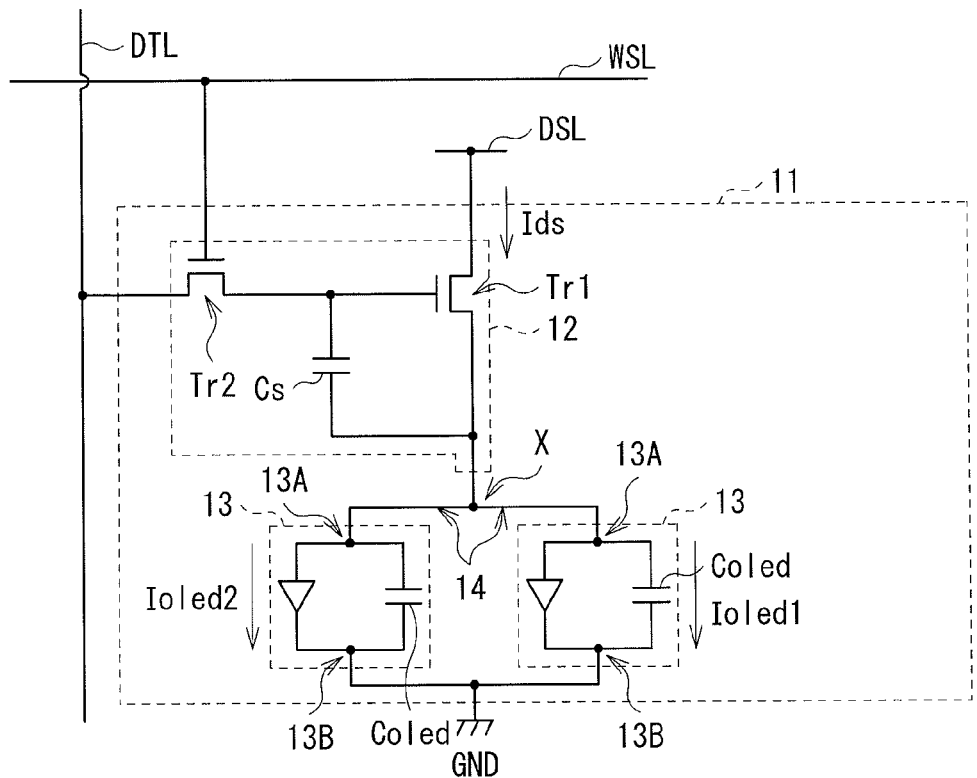
FIG. 2 is a view showing an exemplary circuit configuration of a pixel shown in FIG. 1.

When the pixels 11 are driven by the driving circuit 20 based on the active-matrix scheme, the display panel 10 displays an image based on the image signal 20A inputted from the outside. FIG. 2 shows an exemplary circuit configuration of the pixel 11. Each pixel 11 includes a plurality of organic EL devices 13 connected in parallel to each other, a pixel circuit 12 that drives each of the organic EL devices 13, and a plurality of wiring lines 14 that connect each of the organic EL devices 13 and the pixel circuit 12 directly to each other. Specifically, each pixel 11 includes two organic EL devices 13 connected in parallel to each other, one pixel circuit 12 that drives the organic EL devices 13, and two wiring lines 14 that connect each of the organic EL devices 13 and the pixel circuit 12 directly to each other.

For example, the organic EL device 13 has a configuration in which an organic layer 13C (described later) is interposed between an anode electrode 13A and a cathode electrode 13B. The cathode electrode 13B is a transparent electrode made of a material that has transparency for light generated at the organic layer 13C, and has conductivity. Examples of the material of the cathode electrode 13B include ITO (indium tin oxide), SnO (tin oxide), IZO (indium zinc oxide), and the like.

For example, although not illustrated in the drawings, the organic layer 13C has a lamination structure in which a hole injection layer, a hole transport layer, a light emitting layer, and an electron transport layer are laminated in this order from the cathode electrode 13B side. It is to be noted that, if necessary, the organic layer 13C may include other layers than the above-exemplified layers, or may not include one or both of the hole transport layer and the electron transport layer. In this case, the hole injection layer enhances hole injection efficiency. The hole transport layer enhances hole transport efficiency to the light emitting layer. With the electric field generated between the cathode electrode 13B and the anode electrode 13A, the light emitting layer recombines electrons and holes to generate light. The electron transport layer enhances electron transport efficiency to the light emitting layer.

Figure 3:
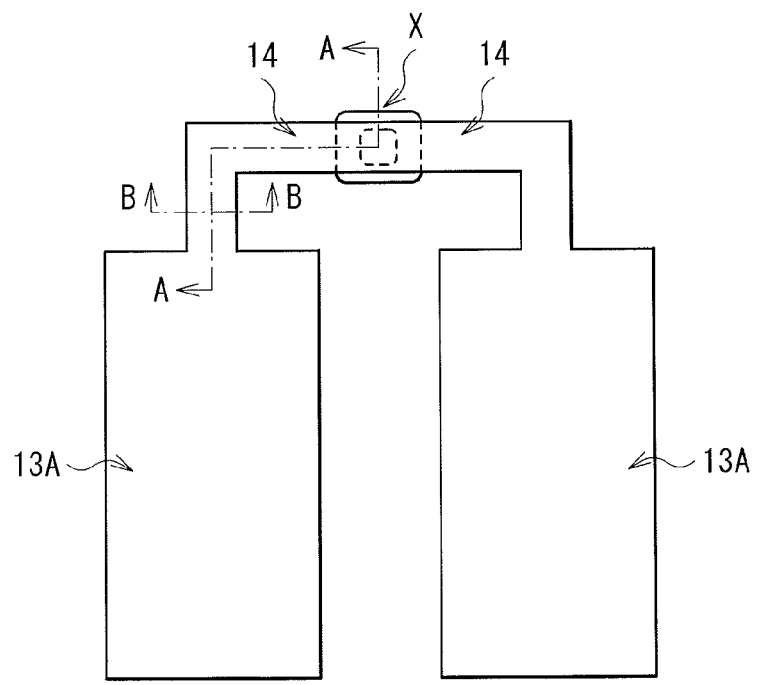
FIG. 3 is a view showing an exemplary layout of anode electrodes and wiring lines shown in FIG. 2.
Figure 4:
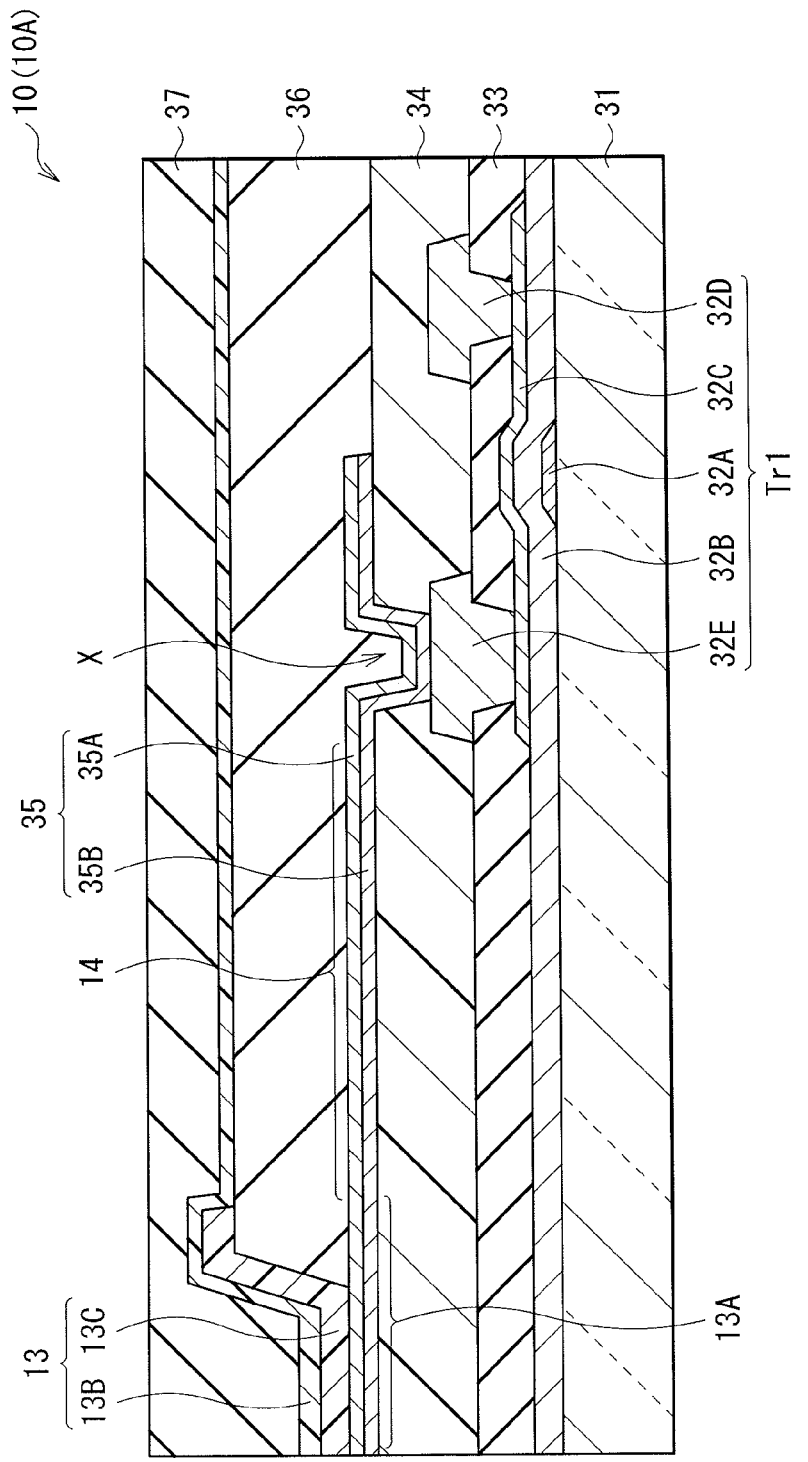
FIG. 4 is a view showing an exemplary cross-sectional configuration taken along and as viewed in an A-A arrow direction shown in FIG. 3.
Figure 5:
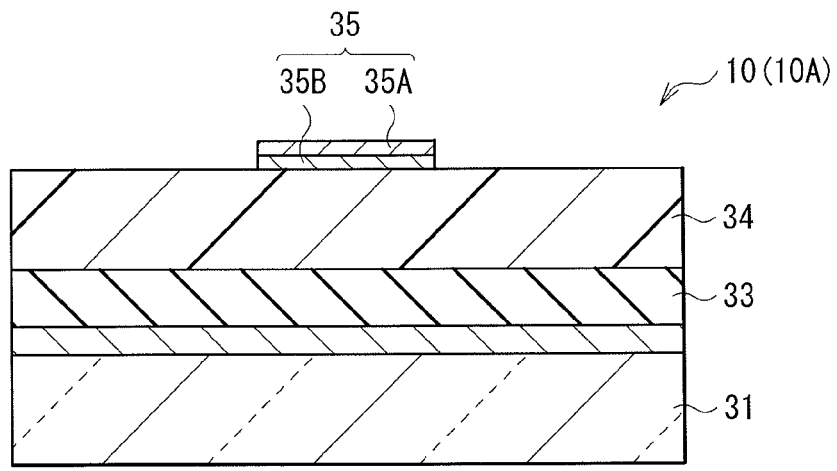
FIG. 5 is a view showing an exemplary cross-sectional configuration taken along and as viewed in a B-B arrow direction shown in FIG. 3.

FIG. 3 shows an exemplary layout of the anode electrode 13A and the wiring lines 14. FIG. 4 is a view showing an exemplary cross-sectional configuration taken along and as viewed in an A-A arrow direction shown in FIG. 3. FIG. 5 is a view showing an exemplary cross-sectional configuration taken along and as viewed in a B-B arrow direction shown in FIG. 3. The anode electrode 13A is a reflecting electrode that reflects light generated at the organic layer 13C at a high reflectance. The anode electrode 13A has a configuration in which a first conductive layer 35A in contact with the organic layer 13C, and a second conductive layer 35B that is in contact with the first conductive layer 35A and has a lower reflectance than that of the first conductive layer 35A are laminated to each other. The first conductive layer 35A is made of a material having high reflectance. Examples of the material of the first conductive layer 35A include aluminum, silver, platinum, gold, chromium, tungsten, nickel, and alloys containing any of these materials. Preferably, the second conductive layer 35B is made of a material that has a lower reflectance than that of the first conductive layer 35A, and absorbs more laser light than the first conductive layer 35A. Examples of the material of the second conductive layer 35B include molybdenum, titanium, and alloys containing any of these materials.

The wiring line 14 is formed in the same plane as the anode electrode 13A. The wiring line 14 has the same layer structure as the anode electrode 13A. Specifically, the wiring line 14 has a configuration in which the first conductive layer 35A and the second conductive layer 35B are laminated to each other. The wiring line 14 is collectively and integrally formed with the anode electrode 13A. The wiring line 14 has a belt-like shape that connects the anode electrode 13A and the pixel circuit 12 (specifically, a source electrode 32E described later). The width of the wiring line 14 is smaller than a width of the anode electrode 13A, and further, is smaller than a width of the source electrode 32E.

For example, the pixel circuit 12 is made up of a driving transistor Tr1, a writing transistor Tr2, and a capacitor Cs, that is, the pixel circuit 12 has a circuit configuration of 2Tr1C. The writing transistor Tr2 applies a signal voltage commensurate with an image signal to a gate of the driving transistor Tr1. Specifically, the writing transistor Tr2 samples a voltage of a signal line DTL described later, and writes the voltage in the gate of the driving transistor Tr1. The driving transistor Tr1 is configured to drive the organic EL device 13, and is connected in series to the organic EL device 13. The driving transistor Tr1 controls a current flowing through the organic EL device 13 according to the magnitude of the voltage written by the writing transistor Tr2. The capacitor Cs holds a predetermined voltage between a gate and a source of the driving transistor Tr1. It is to be noted that the pixel circuit 12 may have a circuit configuration different from the above-described 2Tr1C.

Each of the driving transistor Tr1 and the writing transistor Tr2 is configured of, for example, an n-channel MOS type thin film transistor (TFT). It is to be noted that the type of TFT is not specifically limited, and for example, an inversely-staggered structure (so-called bottom-gate type), or a staggered structure (top-gate type) may be employed. Further, each of the driving transistor Tr1 and the writing transistor Tr2 may be configured of a p-channel MOS type TFT.

The display panel 10 includes a plurality of scan lines WSL extending in a row direction, a plurality of signal lines DTL extending in a column direction, and a plurality of power source lines DSL extending in a row direction. The scan lines WSL are used to select the pixels 11. The signal lines DTL are used to supply a signal voltage commensurate with an image signal to the pixels 11. The power source lines DSL are used to supply a driving current to the pixels 11. The pixels 11 are provided in the proximity of respective intersections of the signal lines DTL and the scan lines WSL. Each of the signal lines DTL is connected to an output terminal (not illustrated) of the signal line driving circuit 23 described later, and to a source or a drain of the writing transistor Tr2. Each of the scan lines WSL is connected to an output terminal (not illustrated) of the scan line driving circuit 24 described later, and to a gate of the writing transistor Tr2. Each of the power source lines DSL is connected to an output terminal (not illustrated) of a power source that outputs a fixed voltage, and to a source or a drain of the driving transistor Tr1.

The gate of the writing transistor Tr2 is connected to the scan line WSL. One of the source and the drain of the writing transistor Tr2 is connected to the signal line DTL, and the other of the source and the drain of the writing transistor Tr2, that is, the terminal not connected to the signal line DTL, is connected to a gate of the driving transistor Tr1. One of the source and the drain of the driving transistor Tr1 is connected to the power source line DSL, and the other of the source and the drain of the driving transistor Tr1, that is, the terminal not connected to the power source line DSL, is connected to an anode of the organic EL device 13. One end of the capacitor Cs is connected to the gate of the driving transistor Tr1, and the other end of the capacitor Cs is connected to the source of the driving transistor Tr1 (in FIG. 2, a terminal on the organic EL device 13 side). That is, the capacitor Cs is interposed between the gate and the source of the driving transistor Tr1. It is to be noted that the organic EL device 13 includes a capacitive element Coled.

As illustrated in FIG. 2, the display panel 10 further includes a ground line GND connected to a cathode of the organic EL device 13. The ground line GND is electrically connected to an external circuit (not illustrated) at a ground potential. The ground line GND is, for example, a sheet-like electrode formed all over the display region 10A. It is to be noted that the ground line GND may be a belt-shaped electrode that forms rectangles corresponding to the pixel rows or the pixel columns. The display panel 10 further includes, for example, a frame region that displays no image in a periphery region of the display region 10A. The frame region is covered with a light blocking member, for example.

Next, with reference to FIG. 4 and FIG. 5, a cross-sectional configuration of the wiring line 14 and the proximity thereof of the display panel 10 will be described. For example, in the proximity of the wiring line 14, the display panel 10 includes, on a transparent substrate 31, a gate electrode 32A, a gate insulating film 32B, a channel layer 32C, and an insulating film 33 in this order from the transparent substrate 31 side. The insulating film 33 includes a plurality of openings. These openings of the insulating film 33 are provided at positions located immediately above respective portions of the channel layer 32C facing each other with the gate electrode 32A therebetween. The display panel 10 includes, for example, a drain electrode 32D and the source electrode 32E that are provided in such a manner as to fill the openings of the insulating film 33.

The display panel 10 further includes, for example, a planarizing layer 34. The planarizing layer 34 includes an opening provided at a position located immediately above the source electrode 32E. The planarizing layer 34 includes on an upper side thereof a flat surface necessary in forming the organic EL device 13. The display panel 10 includes, for example, a conductive layer 35 and an embedding layer 36. The conductive layer 35 is provided in such a manner as to be in contact with the flat surface of the planarizing layer 34 and a top surface of the source electrode 32E exposed in the opening of the planarizing layer 34. The embedding layer 36 is provided with an opening from which a part of the top surface of the conductive layer 35 is exposed. The conductive layer 35 includes the above-described first conductive layer 35A and the second conductive layer 35B. Of the conductive layer 35, a part exposed in the opening of the embedding layer 36 corresponds to the anode electrode 13A of the organic EL device 13. Of the conductive layer 35, the other parts than the part corresponding to the anode electrode 13A corresponds to the wiring line 14. Of the conductive layer 35, a part (connecting part X) in contact with the top surface of the source electrode 32E corresponds to a location where the wiring lines 14 are connected to each other, and connected to the pixel circuit 12. For example, the display panel 10 further includes the organic layer 13C in contact with the top surface of the conductive layer 35 exposed in the opening of the embedding layer 36, the cathode electrode 13B in contact with the entire top surface of the organic layer 13C and the embedding layer 36, and a protective layer 37 that protects the cathode electrode 13B.

Figure 6:
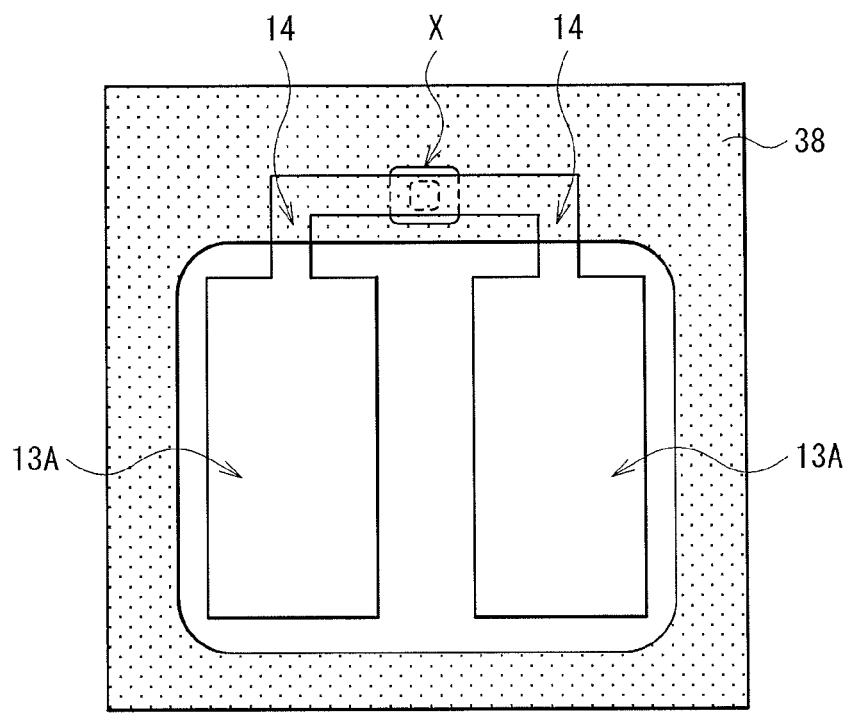
FIG. 6 is a view showing an exemplary relationship between a light shielding layer and the anode electrodes and between the light shielding layer and the wiring lines shown in FIG. 2.
Figure 7:
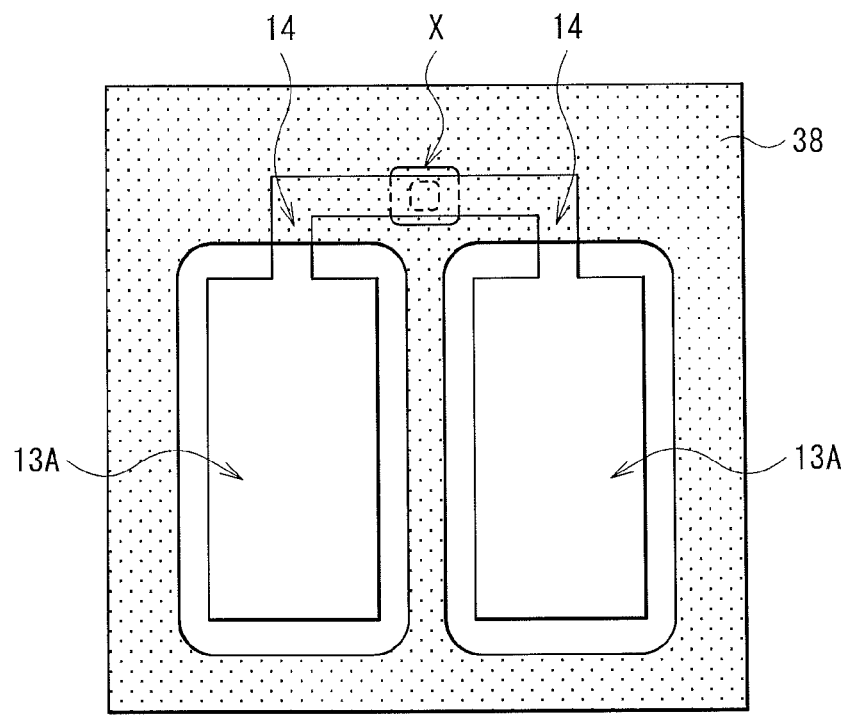
FIG. 7 is a view showing another exemplary relationship between the light shielding layer and the anode electrodes and between the light shielding layer and the wiring lines shown in FIG. 2.

In this case, the display panel 10 does not include, between each wiring line 14 and the transparent substrate 31, the member that blocks laser light at the time of applying laser light to a lower surface of the wiring line 14 (a surface on the second conductive layer 35B side). On the other hand, for example, the display panel 10 includes, between each wiring line 14 and the protective layer 37, a light shielding layer 38 that prevents the silhouette of the wiring lines 14 from being visually recognized in part or in whole from the outside, as illustrated in FIG. 6 and FIG. 7. The light shielding layer 38 is configured of a light shielding member (black matrix, for example), and includes an opening at least at a position located immediately above the anode electrode 13A. It is to be noted that FIG. 6 shows an exemplary case where one opening is provided for each two anode electrodes 13A in the light shielding layer 38. FIG. 7 shows another exemplary case where one opening is provided for each anode electrode 13A in the light shielding layer 38.

(Driving Circuit 20)

Next, the driving circuit 20 will be described. As described above, the driving circuit 20 includes, for example, the timing generating circuit 21, the image signal processing circuit 22, the signal line driving circuit 23, the scan line driving circuit 24, and the power source line driving circuit 25. The timing generating circuit 21 controls the circuits in the driving circuit 20 to operate in conjunction with one another. In response to (in synchronization with) the synchronization signal 20B inputted from the outside, the timing generating circuit 21 outputs a control signal 21A to the above-described circuits, for example.

For example, the image signal processing circuit 22 performs predetermined correction on the image signal 20A that is a digital signal inputted from the outside to obtain an image signal 22A, and outputs the thus-obtained image signal 22A to the signal line driving circuit 23. Examples of the predetermined correction include gamma correction, overdrive correction, and the like.

For example, in response to (in synchronization with) the control signal 21A inputted thereto, the signal line driving circuit 23 applies to the signal lines DTL an analog signal voltage commensurate with the image signal 22A inputted from the image signal processing circuit 22. For example, the signal line driving circuit 23 is capable of outputting two types of voltages (Vofs and Vsig). Specifically, the signal line driving circuit 23 supplies the two types of voltages (Vofs and Vsig) to the pixel 11 selected by the scan line driving circuit 24 through the signal line DTL. In this case, Vsig is a voltage value commensurate with the image signal 20A. Vofs is a constant voltage having no relation to the image signal 20A. The minimum voltage of Vsig is lower than Vofs, and the maximum voltage of Vsig is higher than Vofs.

For example, in response to (in synchronization with) the control signal 21A inputted thereto, the scan line driving circuit 24 sequentially selects the scan lines WSL on a predetermined unit basis. For example, the scan line driving circuit 24 is capable of outputting two types of voltages (Von and Voff). Specifically, the scan line driving circuit 24 supplies to the pixel 11 to be driven the two types of voltages (Von and Voff) through the scan lines WSL in order to turn on or off the writing transistor Tr2. In this case, Von is set to a value equal to or higher than an on-voltage of the writing transistor Tr2. Voff is set to a value lower than the on-voltage of the writing transistor Tr2, and lower than Von.

For example, in response to (in synchronization with) the control signal 21A inputted thereto, the power source line driving circuit 25 sequentially selects the power source lines DSL on a predetermined unit basis. For example, the power source line driving circuit 25 is capable of outputting two types of voltages (Vcc and Vss). In this case, Vss is set to a voltage value lower than a voltage (Vel+Vcath), which is the sum of a threshold voltage Vel of the organic EL device 13 and a cathode voltage Vcath of the organic EL device 13. Vcc is set to a voltage value equal to or higher than the voltage (Vel+Vcath).

[Operation]

Next, an example of operation of the display unit 1 of the present embodiment will be described.

In the display unit 1, a signal voltage (voltage Vsig) commensurate with the image signal 20A is applied to the signal lines DTL by the signal line driving circuit 23, and a selection pulse commensurate with the control signal 21A is sequentially applied to the scan lines WSL and the power source lines DSL by the scan line driving circuit 24 and the power source line driving circuit 25. Thus, the pixel circuit 12 in each pixel 11 is turned on or off, and a driving current is injected into the two organic EL devices 13 in each pixel 11, and consequently, light is generated by the recombination of holes and electrons, and the generated light is outputted to the outside. As a result, an image is displayed in the display region 10A of the display panel 10.

[Improvement of Unlit Defect]

Figure 8:
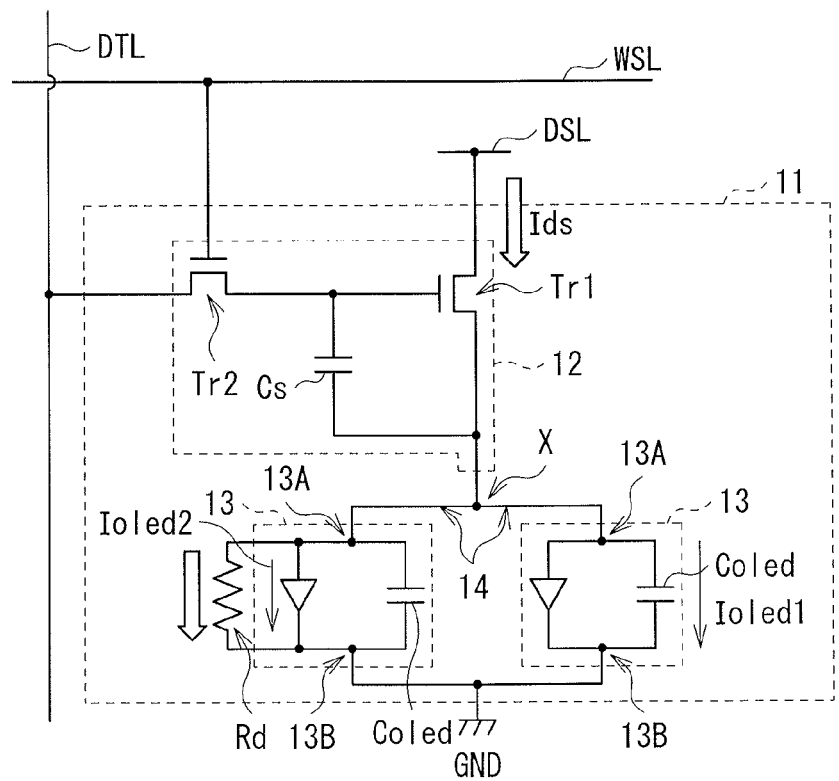
FIG. 8 is a view showing an exemplary state of an unlit defect occurring at the pixel shown in FIG. 1.

Next, a method of improving an unlit defect in the display unit 1 of the present embodiment will be described. FIG. 8 shows an exemplary state of an unlit defect of the pixel 11. In FIG. 8, a low-resistance Rd corresponds to a foreign substance having entered the display unit in a process of forming the organic EL device 13. Due to the entrance of the foreign substance, a short circuit between electrodes is occurred in one of the two organic EL devices 13 connected in parallel to each other. Therefore, a current larger than usual flows in the low-resistance Rd and the driving transistor Tr1, and only a current far smaller than usual flows in the two organic EL devices 13. As a result, the two organic EL devices 13 do not emit light, and the pixel 11 becomes an unlit defect.

Figure 9:
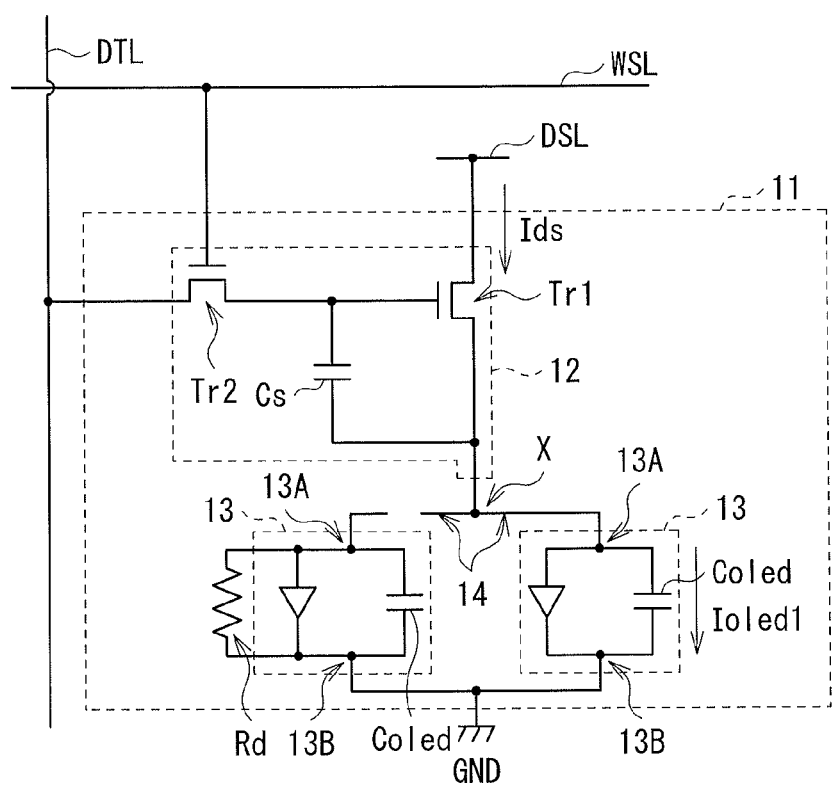
FIG. 9 is a view showing an exemplary state where a wiring line is disconnected.
Figure 10:
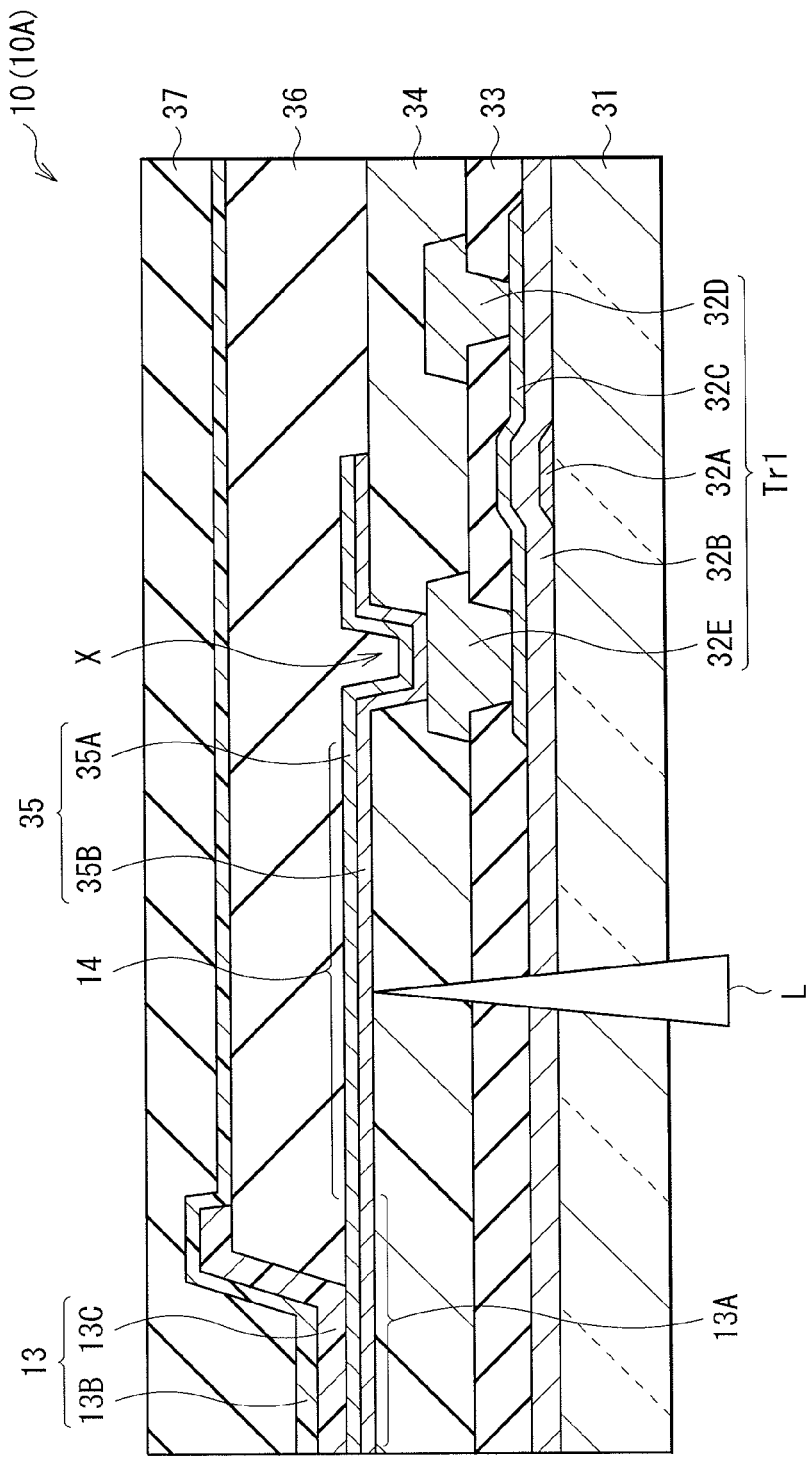
FIG. 10 is a view showing an exemplary state where laser light is applied to a wiring line.

In this case, in the present embodiment, a path of the current flowing through the low-resistance Rd formed by the mixing-in of the foreign substance is separated from a path of a current flowing between the drain and the source of the driving transistor Tr1 as illustrated in FIG. 9 for example. Specifically, as illustrated in FIG. 10, laser light L is applied to the lower surface of the wiring line 14 (the surface on the second conductive layer 35B side) connected in series to the low-resistance Rd. At this time, the second conductive layer 35B having a low reflectance is provided on the lower surface of the wiring line 14, and further, the width of the wiring line 14 is smaller than the width of the anode electrode 13A. Therefore, even when the energy of the laser light L is not so high, not only the second conductive layer 35B but also the first conductive layer 35A is removed by the application of the laser light L. As a result, the wiring line 14 is disconnected, whereby the path of the current flowing through the low-resistance Rd is separated from the path of the current flowing between the drain and the source of the driving transistor Tr1. Consequently, the pixel 11 as the unlit defect is restored.

[Effect]

Next, an effect of the display unit 1 of the present embodiment will be described. In the present embodiment, each of the wiring lines 14 connecting each organic EL device 13 and the pixel circuit 12 directly to each other is formed in the same plane as the anode electrode 13A, and is smaller in width than the anode electrode 13A. With this configuration, for example, even when any of the organic EL devices 13 becomes a defect due to a short circuit between electrodes or the like, and thus the pixel 11 becomes an unlit defect, it is possible to restore the pixel as the unlit defect by disconnecting the wiring line 14 directly connecting the organic EL device 13 as the defect and the pixel circuit 12 by a method such as, but not limited to, laser irradiation. Therefore, it is possible to improve the unlit defect without making the pixel circuit 12 complicated.

2. MODIFICATIONS

Hereinafter, various modifications of the display unit 1 of the above-mentioned embodiment will be described. It is to be noted that, in the following description, the same components as those of the display unit 1 of the above-mentioned embodiment are given the same reference numerals. Further, descriptions of the same components as those of the display unit 1 of the above-mentioned embodiment will be appropriately omitted.

Figure 11:
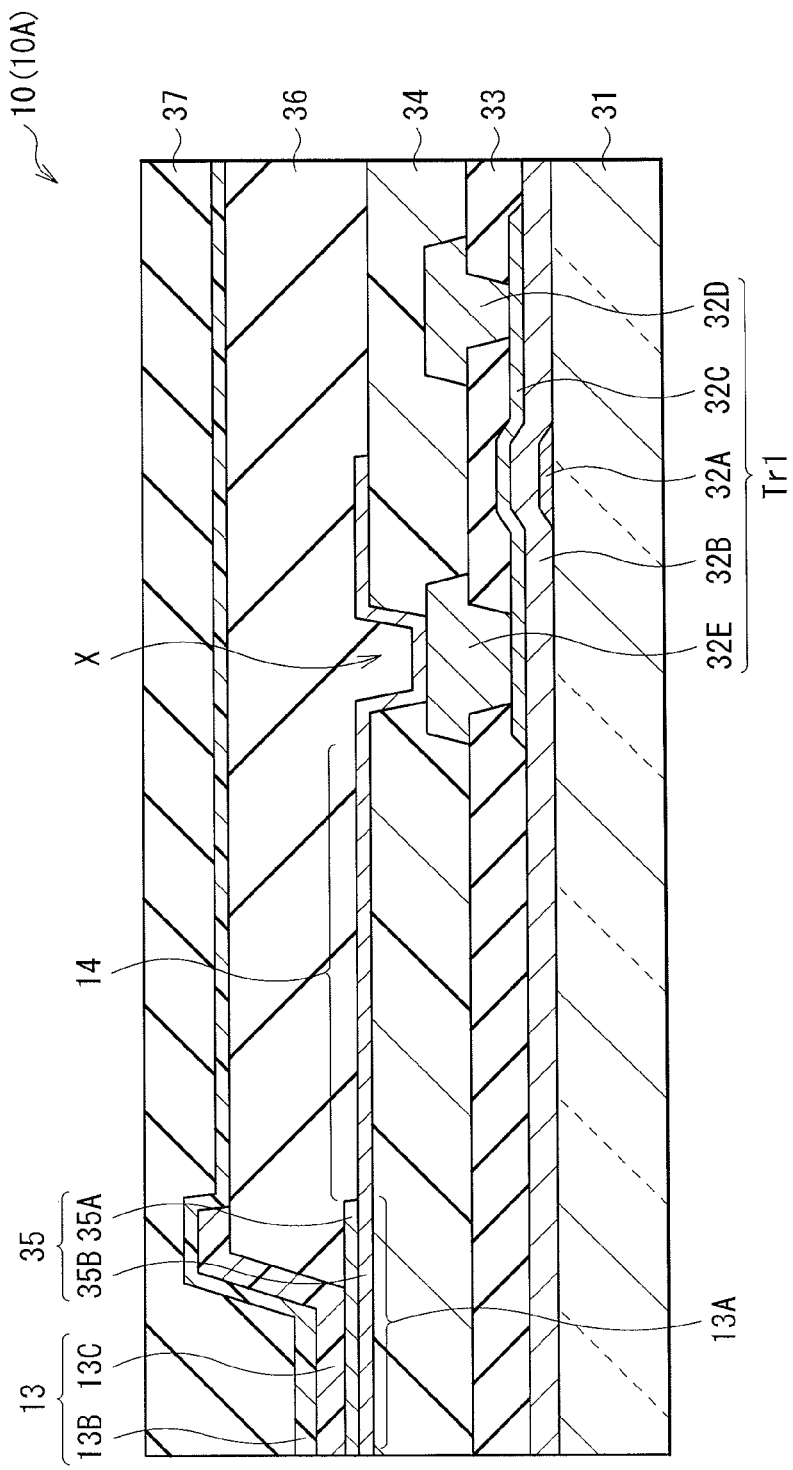
FIG. 11 is a view showing another exemplary cross-sectional configuration taken along and as viewed in an A-A arrow direction shown in FIG. 3.

While the wiring line 14 and the anode electrode 13A have the same lamination structure in the above-mentioned embodiment, the wiring line 14 may have a single layer structure including only the second conductive layer 35B as illustrated in FIG. 11, for example. In other words, in the present modification, the wiring line 14 is formed in the same plane as the second conductive layer 35B of the anode electrode 13A, and is made of the same material as the second conductive layer 35B of the anode electrode 13A. With this configuration, it is possible to save the energy of the laser light L necessitated upon the disconnection of the wiring line 14. Incidentally, in order to form the anode electrode 13A having a lamination structure and the wiring line 14 having a single layer structure, it is preferable to adopt a manufacturing method described below, for example.

Figure 12:
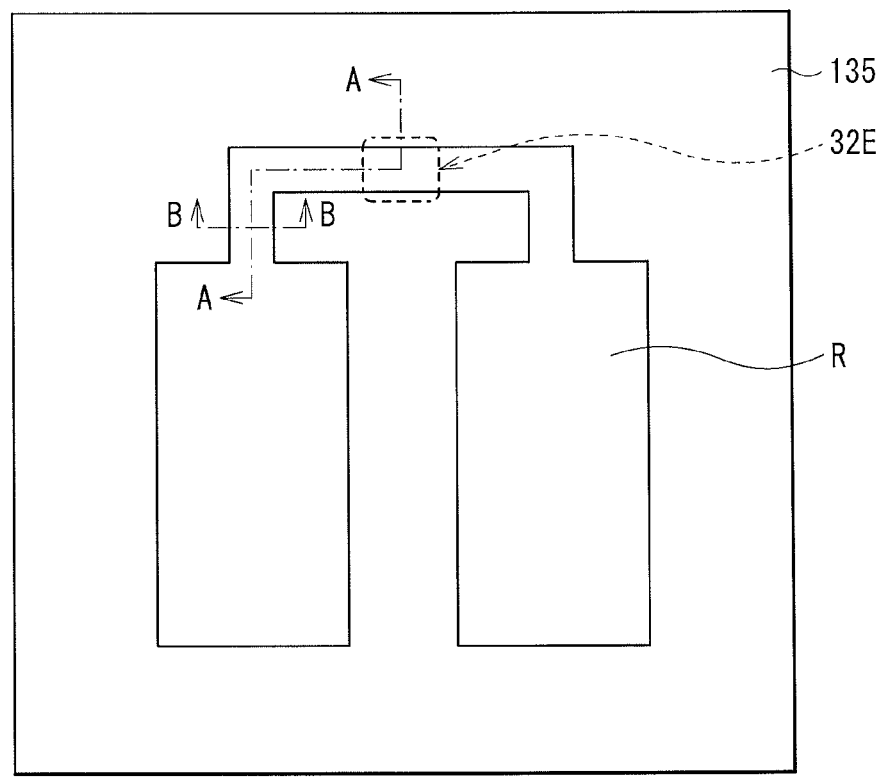
FIG. 12 is a plan view for describing an exemplary method of manufacturing a wiring line illustrated in FIG. 11.

FIG. 12 to FIG. 15B show an exemplary manufacturing process of the wiring line 14 according to the present modification. FIG. 12 illustrates a planar configuration. FIG. 13A, FIG. 14A, and FIG. 15A each illustrate a configuration corresponding to a cross-section taken along a line A-A of FIG. 12, and FIG. 13B, FIG. 14B, and FIG. 15B each illustrate a configuration corresponding to a cross-section taken along a line B-B of FIG. 12.

Figure 13A:
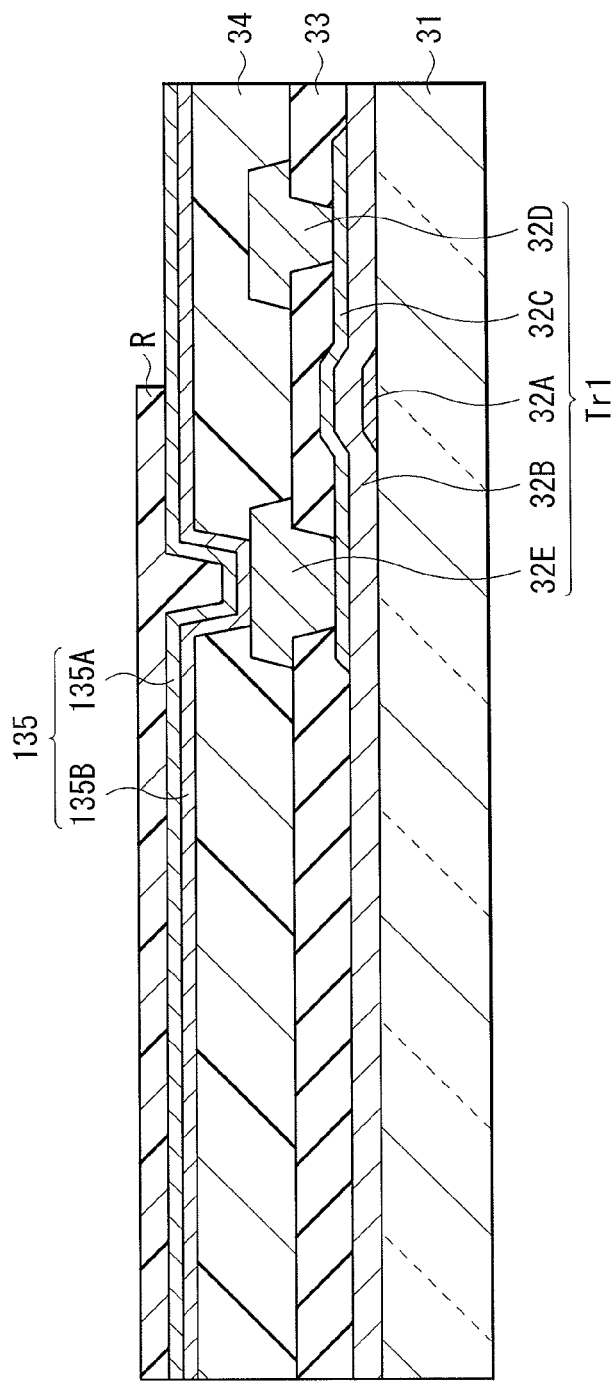
FIGS. 13A and 13B are sectional views for describing a step subsequent to that illustrated in FIG. 12.
Figure 13B:
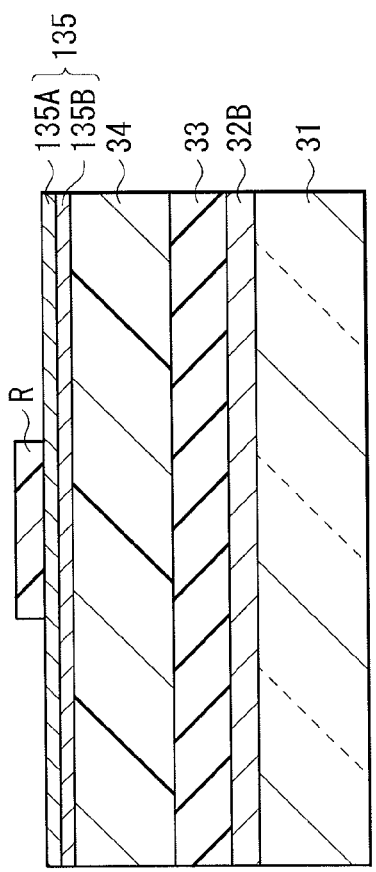

First, on the transparent substrate 31, the driving transistor Tr1, the writing transistor Tr2, and so forth are formed, and the insulating film 33 and the planarizing layer 34 are formed. At this time, an opening is previously provided to the planarizing layer 34 at a position located immediately above the source electrode 32E. Next, a second conductive layer 135B made of titanium or a titanium alloy and a first conductive layer 135A made of aluminum or an aluminum alloy are laminated in this order over the entire front surface, to form a conductive layer 135. Thereafter, on the conductive layer 135 (first conductive layer 135A), a resist layer R having a planar shape corresponding to a planar shape defined by a plurality of (two) anode electrodes 13A and a plurality of (two) wiring lines 14 is formed (FIG. 12, FIG. 13A, and FIG. 13B). At this time, of the resist layer R, the width of a part corresponding to the (two) wiring lines 14 is made smaller than the width of a part corresponding to the anode electrodes 13A. Further, of the resist layer R, a part corresponding to the (two) wiring lines 14 is so formed as to cover the opening of the planarizing layer 34.

Next, with the resist layer R serving as a mask, the conductive layer 135 is selectively removed. Specifically, with the resist layer R serving as a mask, dry etching is performed to selectively remove both the first conductive layer 135A and the second conductive layer 135B. As a result, as illustrated in FIGS. 14A and 14B, the first conductive layer 135A and the second conductive layer 135B remain only in a region located immediately blow the resist layer R. Then, with the resist layer R serving as a mask, a part of the first conductive layer 135A is selectively removed. Specifically, with the resist layer R serving as a mask, wet etching is performed to selectively remove a part having a small width of the first conductive layer 135A. As a result, as illustrated in FIGS. 15A and 15B, only the first conductive layer 135A in a region corresponding to the wiring line 14 is removed, and the first conductive layer 135A in a region corresponding to the anode electrode 13A is not removed and remains. Thereafter, the resist layer R is removed. In this manner, the anode electrode 13A having a lamination structure and the wiring line 14 having a single layer structure are formed together.

Next, the embedding layer 36 having an opening at which a part of the top surface of the conductive layer 35 is exposed is formed. Then, the organic layer 13C in contact with the top surface of the conductive layer 35 exposed in the opening of the embedding layer 36, the cathode electrode 13B in contact with the entire top surface of the organic layer 13C and the embedding layer 36, and a protective layer 37 that protects the cathode electrode 13B are formed. In this manner, the display panel 10 according to the present modification is formed.

3. APPLICATION EXAMPLES

Hereinafter, application examples of the display unit 1 described in the above embodiment will be described. The display unit 1 of the above-mentioned embodiment is applicable to any of display units of electronic apparatuses in various fields such as, but not limited to, a television, a digital camera, a notebook personal computer, mobile terminal apparatuses including a mobile phone, a smart phone, and the like, and a video camcorder, in which an externally inputted image signal or an internally generated image signal is displayed as an image or a moving image.

Application Example 1

Figure 16:
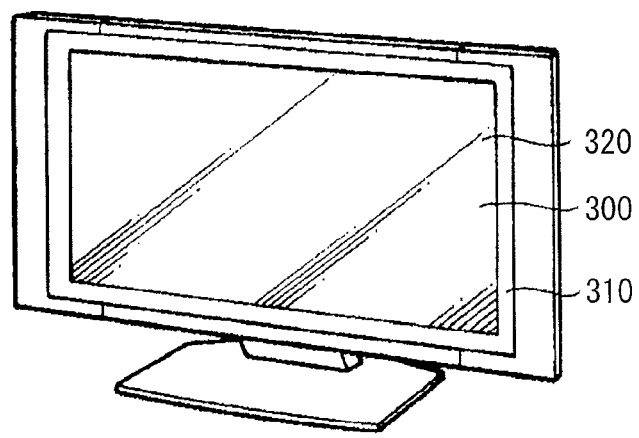
FIG. 16 is a perspective view showing an external appearance of an application example 1 of the display unit of any one of the above-mentioned embodiments.

FIG. 16 shows an external appearance of a television to which the display unit 1 of the above-mentioned embodiment is applied. This television includes, for example, an image display screen section 300 including a front panel 310 and a filter glass 320. The image display screen section 300 is configured of the display unit 1 according to the above-mentioned embodiment.

Application Example 2

Figure 17A:
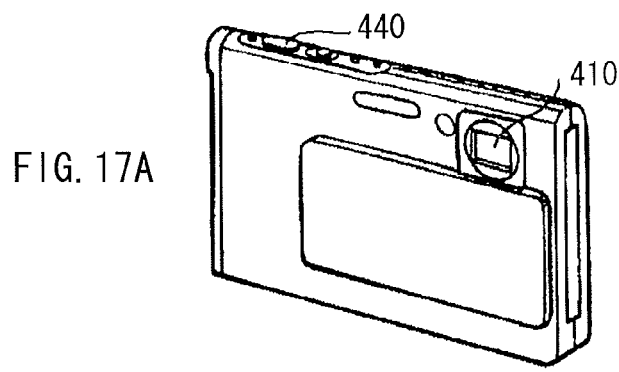
FIG. 17A is a perspective view showing an external appearance of an application example 2 as viewed from a front side.
Figure 17B:
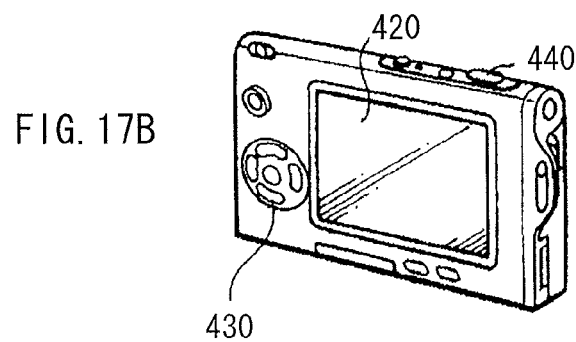
FIG. 17B is a perspective view showing an external appearance of the application example 2 as viewed from a rear side.

FIGS. 17A and 17B each show an external appearance of a digital camera to which the display unit 1 of the above-mentioned embodiment is applied. This digital camera includes, for example, a light emitting section 410 that generates flash light, a display section 420, a menu switch 430, and a shutter button 440. The display section 420 is configured of the display unit 1 according to the above-mentioned embodiment.

Application Example 3

Figure 18:
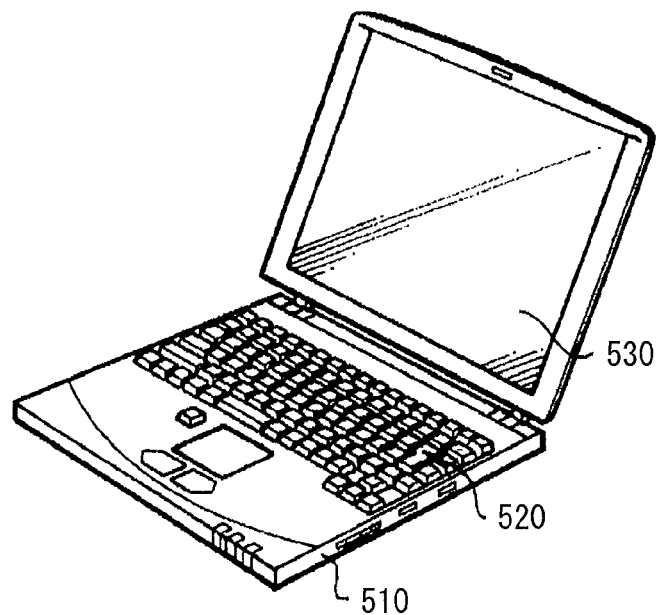
FIG. 18 is a perspective view showing an external appearance of an application example 3.

FIG. 18 shows an external appearance of a notebook personal computer to which the display unit 1 of the above-mentioned embodiment is applied. This notebook personal computer includes, for example, a main body 510, a keyboard 520 used to input letters and the like, and a display section 530 that displays an image. The display section 530 is configured of the display unit 1 according to the above-mentioned embodiment.

Application Example 4

Figure 19:
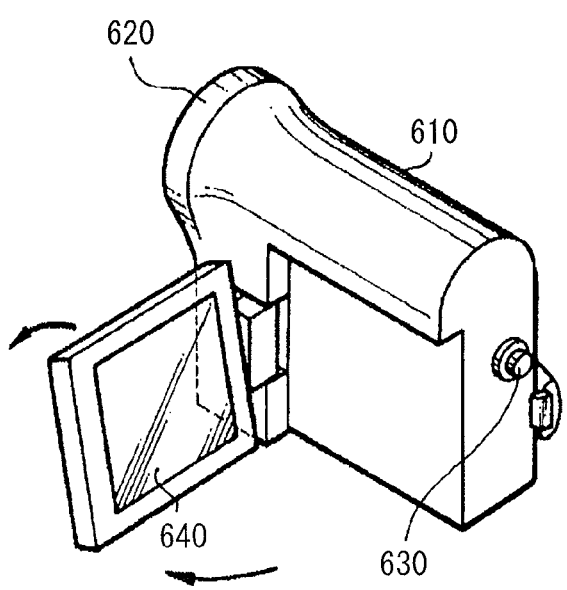
FIG. 19 is a perspective view showing an external appearance of an application example 4.

FIG. 19 shows an external appearance of a video camcorder to which the display unit 1 of the above-mentioned embodiment is applied. This video camcorder includes, for example, a main body section 610, a lens 620 provided on a front face of the main body section 610 and used to take an image of a subject, a start-and-stop switch 630 used upon taking an image, and a display section 640. The display section 640 is configured of the display unit 1 according to the above-mentioned embodiment.

Application Example 5

FIGS. 20A to 20G each show an external appearance of a mobile phone to which the display unit 1 of the above-mentioned embodiment is applied. This mobile phone includes, for example, an upper side housing 710, a lower side housing 720, a coupling section (hinge section) 730 that couples the upper side housing 710 and the lower side housing 720, a display 740, a sub-display 750, a picture light 760, and a camera 770. The display 740 or the sub-display 750 is configured of the display unit 1 according to the above-mentioned embodiment.

Hereinabove, while the present technology has been described with reference to the embodiment, the modification, and the application examples, the present technology is not limited to the above-mentioned embodiment and so forth, and various modifications may be made.

For example, the configuration of the pixel circuit 12 for the active matrix driving is not limited to the configuration mentioned in the above embodiment, and a capacitive element and a transistor may be added as necessary. In that case, other than the above-described signal line driving circuit 23, the scan line driving circuit 24, the power source line driving circuit 25, and so forth, a driving circuit necessitated by the change of the pixel circuit 12 may be added.

Accordingly, it is possible to achieve at least the following configurations from the above-described example embodiments, the modifications, and the application examples of the disclosure.

(1) A display panel with a plurality of pixels, each of the pixels including:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;
a pixel circuit driving the light emitting devices; and
a plurality of wiring lines connecting each of the light emitting devices and the pixel circuit directly to each other, each of the wiring lines being provided in a same plane as the reflecting electrode, and having a width smaller than a width of the reflecting electrode.

(2) The display panel according to (1), wherein the wiring lines and the reflecting electrode each include: a first conductive layer in contact with the organic layer; and a second conductive layer in contact with the first conductive layer, the first conductive layer and the second conductive layer being laminated to each other, and the second conductive layer having a reflectance lower than a reflectance of the first conductive layer.

(3) The display panel according to (1), wherein
the reflecting electrode includes: a first conductive layer in contact with the organic layer; and a second conductive layer in contact with the first conductive layer, the first conductive layer and the second conductive layer being laminated to each other, and the second conductive layer having a reflectance lower than a reflectance of the first conductive layer, and
each of the wiring lines is provided in a same plane as the second conductive layer, and is made of a same material as the second conductive layer.

(4) The display panel according to (3), wherein
the first conductive layer is made of one of aluminum and an aluminum alloy, and
the second conductive layer and the wiring lines are made of one of titanium and a titanium alloy.

(5) The display panel according to any one of (1) to (4), further including a light shielding layer that prevents part or all of a silhouette of the wiring lines from being visually recognized from outside.

(6) A display unit with a display panel and a driving circuit that drives the display panel, the display panel being provided with a plurality of pixels, each of the pixels including:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;
a pixel circuit driving the light emitting devices; and
a plurality of wiring lines connecting each of the light emitting devices and the pixel circuit directly to each other, each of the wiring lines being provided in a same plane as the reflecting electrode, and having a width smaller than a width of the reflecting electrode.

(7) An electronic apparatus with a display unit, the display unit being provided with a display panel and a driving circuit that drives the display panel, the display panel being provided with a plurality of pixels, each of the pixels including:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;

a pixel circuit driving the light emitting devices; and a plurality of wiring lines connecting each of the light emitting devices and the pixel circuit directly to each other, each of the wiring lines being provided in a same plane as the reflecting electrode, and having a width smaller than a width of the reflecting electrode.

(8) A method of manufacturing a display panel, the method comprising:

laminating a second conductive layer and a first conductive layer in this order over a surface, the second conductive layer being made of one of titanium and a titanium alloy, and the first conductive layer being made of one of aluminum and an aluminum alloy;

forming, on the first conductive layer, a resist layer having a planar shape corresponding to a planar shape defined by a plurality of reflecting electrodes and a plurality of wiring lines, followed by removing selectively both the first conductive layer and the second conductive layer through dry etching using the resist layer as a mask; and removing selectively a part having a small width of the first conductive layer through wet etching using the resist layer as the mask, wherein the display panel includes a plurality of pixels, each of the pixels including a plurality of light emitting devices connected in parallel to one another, each of the light emitting devices including a transparent electrode, the reflecting electrode, and an organic layer interposed between the transparent electrode and the reflecting electrode, and the organic layer having a light emitting layer, a pixel circuit driving the light emitting devices, and the plurality of wiring lines connecting each of the light emitting devices and the pixel circuit directly to each other, each of the wiring lines being provided in a same plane as the reflecting electrode, and having a width smaller than the width of the reflecting electrode.

The present disclosure contains subject matter related to that disclosed in Japanese Priority Patent Application JP 2012-054068 filed in the Japan Patent Office on Mar. 12, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display panel with a plurality of pixels, each of the pixels comprising:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;
a pixel circuit driving the light emitting devices; and
a plurality of wiring lines connecting each of the light emitting devices and the pixel circuit directly to each other, each of the wiring lines being provided in a same plane as the reflecting electrode, and having a width smaller than a width of the reflecting electrode.

2. The display panel according to claim 1, wherein the wiring lines and the reflecting electrode each include: a first conductive layer in contact with the organic layer; and a second conductive layer in contact with the first conductive layer, the first conductive layer and the second conductive layer being laminated to each other, and the second conductive layer having a reflectance lower than a reflectance of the first conductive layer.

3. The display panel according to claim 1, wherein
the reflecting electrode includes: a first conductive layer in contact with the organic layer; and a second conductive layer in contact with the first conductive layer, the first conductive layer and the second conductive layer being laminated to each other, and the second conductive layer having a reflectance lower than a reflectance of the first conductive layer, and
each of the wiring lines is provided in a same plane as the second conductive layer, and is made of a same material as the second conductive layer.

4. The display panel according to claim 3, wherein
the first conductive layer is made of one of aluminum and an aluminum alloy, and
the second conductive layer and the wiring lines are made of one of titanium and a titanium alloy.

5. The display panel according to claim 1, further comprising a light shielding layer that prevents part or all of a silhouette of the wiring lines from being visually recognized from outside.

6. A display unit with a display panel and a driving circuit that drives the display panel, the display panel being provided with a plurality of pixels, each of the pixels comprising:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;
a pixel circuit driving the light emitting devices; and
a plurality of wiring lines connecting each of the light emitting devices and the pixel circuit directly to each other, each of the wiring lines being provided in a same plane as the reflecting electrode, and having a width smaller than a width of the reflecting electrode.

7. An electronic apparatus with a display unit, the display unit being provided with a display panel and a driving circuit that drives the display panel, the display panel being provided with a plurality of pixels, each of the pixels comprising:
a plurality of light emitting devices connected in parallel to one another, each of the light emitting devices including a transparent electrode, a reflecting electrode, and an organic layer interposed between the transparent electrode and the reflecting electrode, and the organic layer having a light emitting layer;
a pixel circuit driving the light emitting devices; and
a plurality of wiring lines connecting each of the light emitting devices and the pixel circuit directly to each other, each of the wiring lines being provided in a same plane as the reflecting electrode, and having a width smaller than a width of the reflecting electrode.

* * * * *